United States Patent [19]

Hiltpold

[11] 4,271,418
[45] Jun. 2, 1981

[54] VMOS MEMORY CELL AND METHOD FOR MAKING SAME

[75] Inventor: William R. Hiltpold, San Jose, Calif.

[73] Assignee: American Microsystems, Inc., Santa Clara, Calif.

[21] Appl. No.: 89,612

[22] Filed: Oct. 29, 1979

[51] Int. Cl.$^3$ ............................................ H01L 29/78
[52] U.S. Cl. ....................................... 357/23; 357/41; 357/55
[58] Field of Search ............................. 357/23, 41, 55

[56] References Cited

U.S. PATENT DOCUMENTS

| | | | |
|---|---|---|---|
| 4,003,036 | 1/1977 | Jenne | 340/173 R |
| 4,109,270 | 8/1978 | Von Basse et al. | 357/23 |
| 4,116,720 | 9/1978 | Vinson | 148/1.5 |

Primary Examiner—Martin H. Edlow
Attorney, Agent, or Firm—Alan H. MacPherson

[57] ABSTRACT

A semiconductor memory device is provided comprised of an integrated array of cells formed on a substrate in conjunction with parallel spaced-apart bit lines and conductive word lines that are perpendicular to the bit lines. A plurality of V-shaped recesses are located between and extend perpendicular to adjacent parallel bit lines. Two cells share each recess and each cell includes a VMOS transistor formed by one end portion of the recess and an isolated buried source region located under the adjacent bit line. A channel stop region is located between and isolates the VMOS transistors and their respective buried source regions at opposite ends of each recess. Thus, the VMOS pass gate is shared between adjacent bit lines and bit line capacitance is minimized. Also, the VMOS pass gates are self-aligned to eliminate alignment tolerances and minimize bit line capacitance. The invention also includes an efficient method for producing a semiconductor memory device with such an array of cells.

6 Claims, 15 Drawing Figures

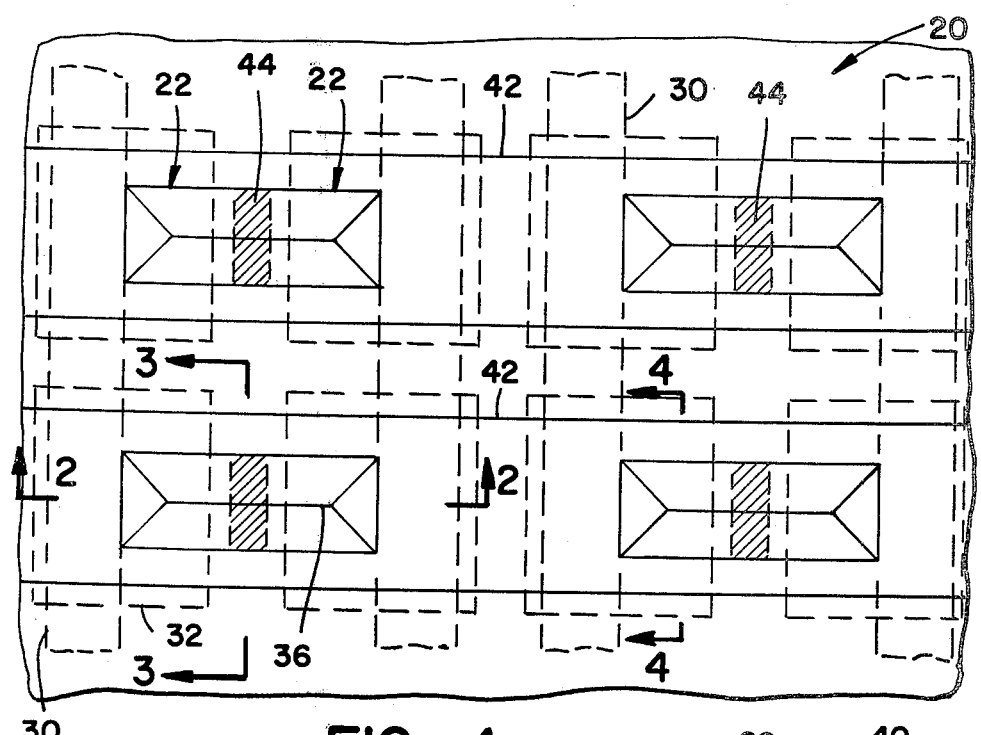
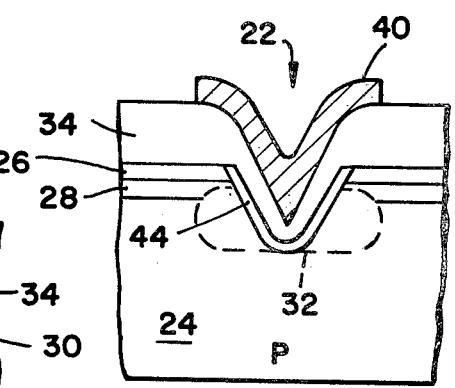
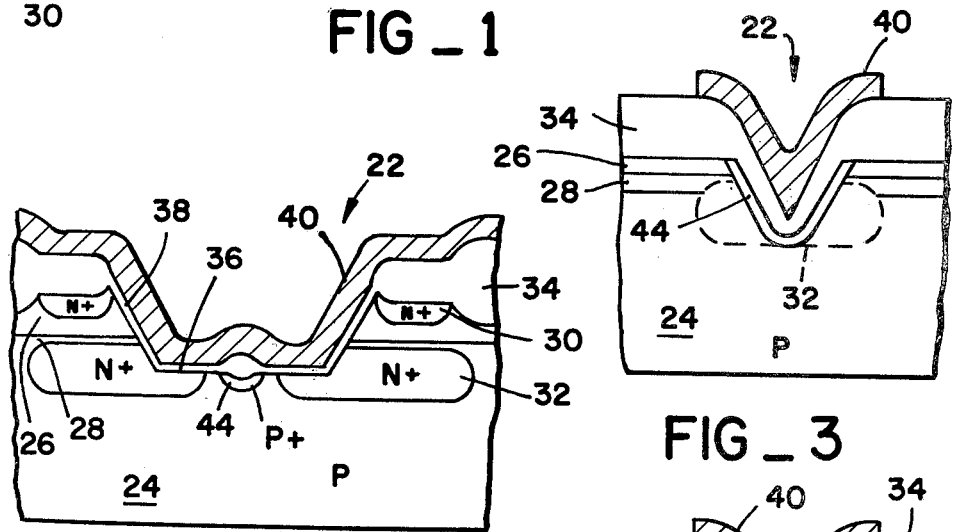
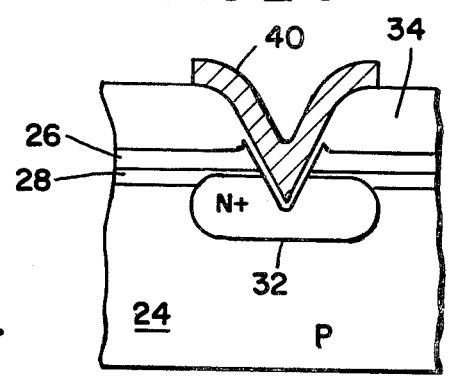
FIG_1
FIG_2
FIG_3
FIG_4

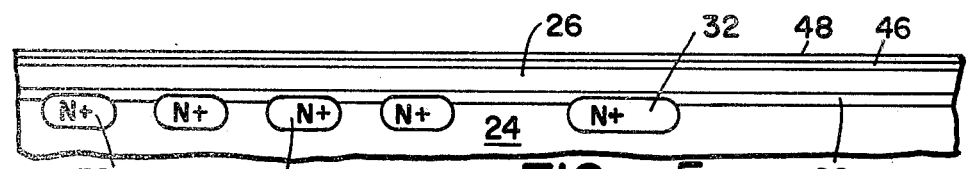
FIG_5
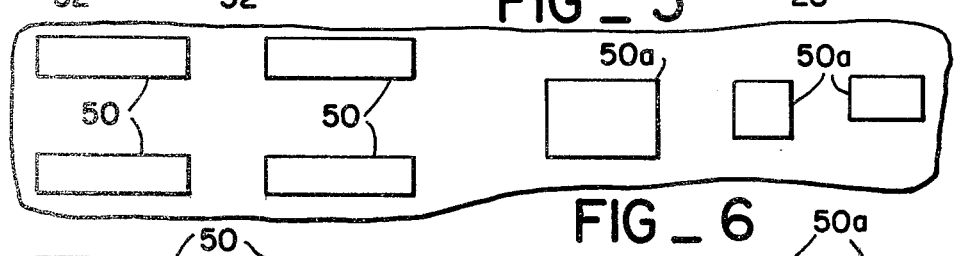
FIG_6
FIG_7
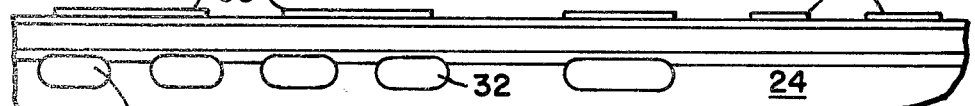
FIG_8
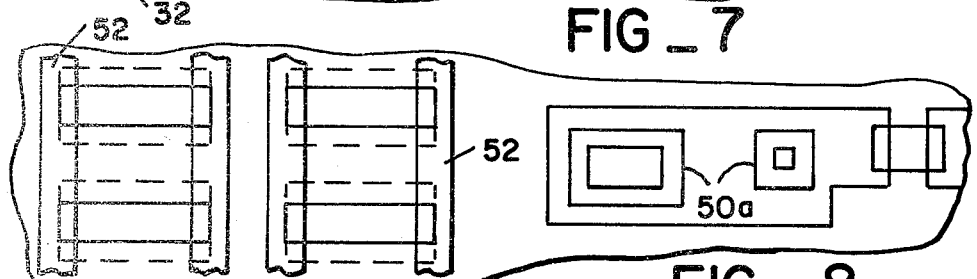
FIG_9
FIG_10
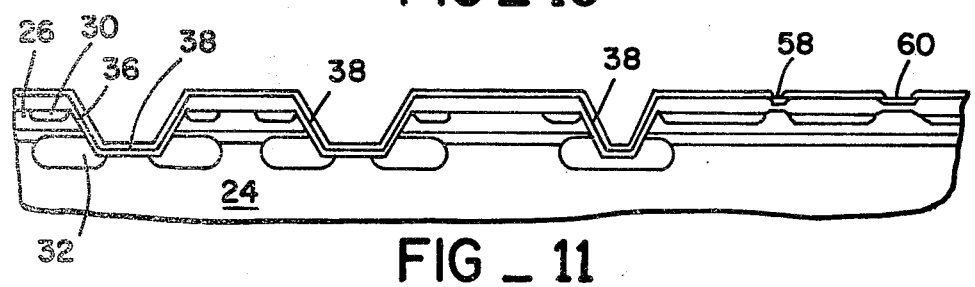
FIG_11

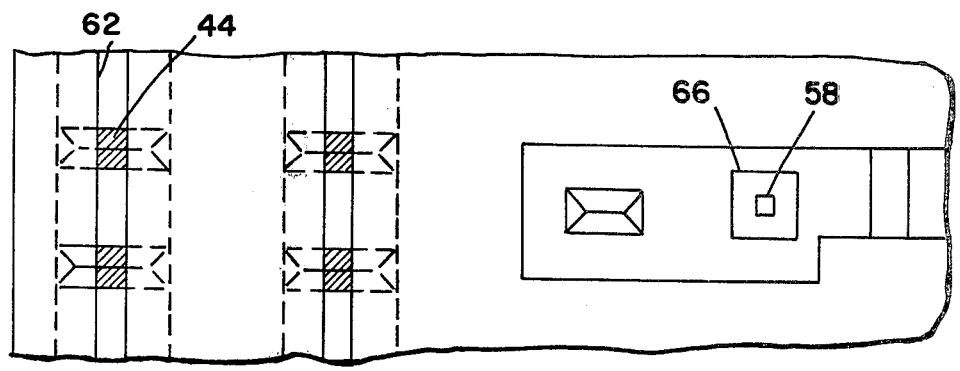
FIG_12
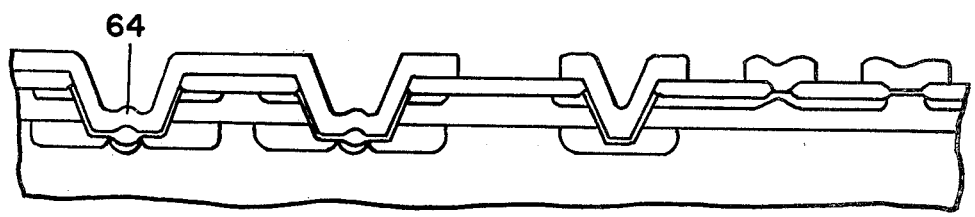
FIG_13
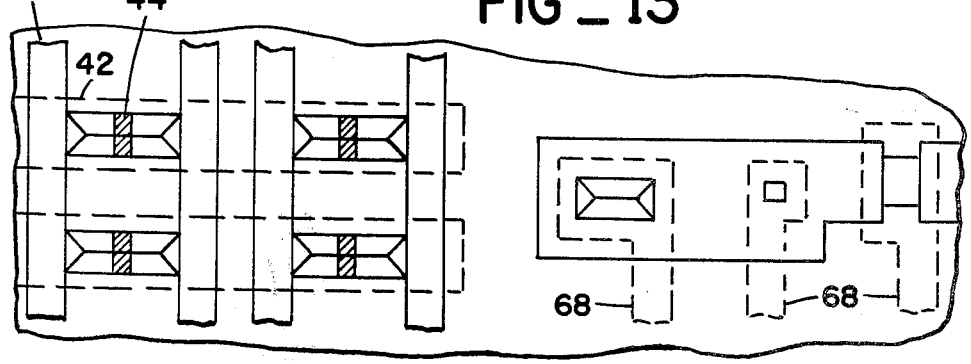
FIG_14
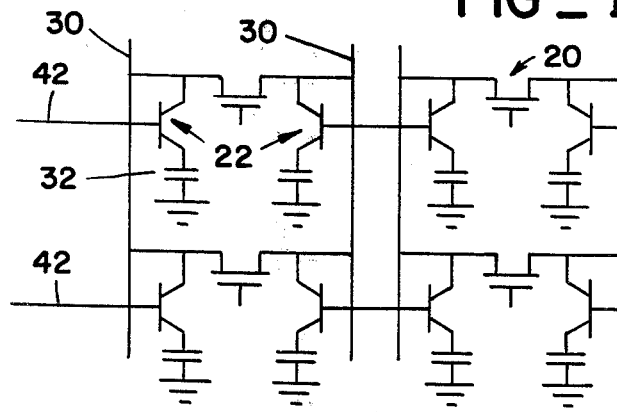
FIG_15

VMOS MEMORY CELL AND METHOD FOR MAKING SAME

BACKGROUND OF THE INVENTION

This invention relates to semiconductor memory devices and more particularly, it relates to a VMOS-type integrated circuit random access memory device with improved performance characteristics and to a method for fabricating such devices.

In the development of semiconductor memory devices and for digital computers, a considerable effort has been made to increase the number of memory cells per unit area, improve reliability, speed, and to reduce operating power, and also provide a device with a large number of cells that can be manufactured with relatively high yield factors. One important step forward in the art that fulfilled the aforesaid objectives to a significant degree is disclosed in U.S. Pat. No. 4,003,036, which is assigned to the assignee of the present invention. In the aforesaid patent, a single VMOS transistor memory cell is provided in conjunction with a buried and isolated source region formed within the substrate directly below a diffused bit line of the same conductivity type material. The VMOS transistor is formed by a V-shaped recess that extends through the diffused bit line and into the buried source region and a word line extends through the recess and forms an integral gate region therewith. One disadvantage with the aforesaid arrangement was that the VMOS drain overlap around the upper edge of the V-groove recess caused relatively larger bit line area, thereby increasing overall bit line capacitance while also requiring a relatively large cell. The present invention overcomes these problems while maintaining the basic inherent advantages of the V-groove and buried source combination in an integrated circuit semiconductor memory device.

BRIEF SUMMARY OF THE INVENTION

In accordance with the present invention an integrated circuit memory device is provided comprised of an array of random access memory cells located between parallel and spaced-apart bit lines. Each cell is formed from one end portion of a single V-shaped recess or groove that extends between and perpendicular to a pair of adjacent and spaced-apart bit lines. The bit lines of one conductivity-type material are diffused in a substrate of the opposite conductivity-type material. A series of associated buried source regions are located at spaced-apart intervals under the bit lines and have the same conductivity type as the bit lines. Each VMOS recess for a pair of cells is self-aligned to the bit lines to eliminate alignment tolerances. A transverse channel stopping region located between end portions of each V-shaped recess serves to isolate electrically the two cells formed at its opposite ends. Conductive word lines extend perpendicular to the bit lines and into aligned V-shaped recesses to form gates for the transistor cells within each recess.

Thus, each single V-shaped recess between pairs of bit lines serves for two memory cells, and as a result, a substantial reduction in chip area per cell is possible. The invention also provides a process for making the memory device just described which is particularly efficient in that it provides not only for the formation of the memory core comprised of the various cells but also an efficient process for forming the simultaneously peripheral logic elements for the device.

In summary, the objects of the invention are to provide an improved random access semiconductor memory that: (1) minimizes chip area of the memory device by including two VMOS memory cells within one elongated V-groove recess between adjacent bit lines; (2) provides improved operating characteristics by minimizing bit line capacitance; and (3) provides an efficient method of fabrication utilizing V-groove recesses that are self-aligned with the bit line edges to eliminate alignment tolerances in the cells.

Other objects, advantages and features of the present invention will become apparent from the following description of one embodiment presented in conjunction with the accompanying drawing.

BRIEF DESCRIPTION OF THE DRAWING

FIG. 1 is a plan view showing a portion of the core section of a memory device comprised of cells according to the present invention;

FIG. 2 is a view in section taken along line 2—2 of FIG. 1;

FIG. 3 is a view in section taken along line 3—3 of FIG. 1;

FIG. 4 is a view in section taken along line 4—4 of FIG. 1;

FIGS. 5-14 are a series of fragmentary views illustrating the various method steps for forming a memory device according to the invention; and FIG. 15 is a diagrammatic view showing a portion of a memory core circuit for the memory device of the invention.

DETAILED DESCRIPTION OF THE INVENTION

With reference of the drawing, FIG. 1 shows in plan view a portion of a semiconductor memory device 20 comprised of a plurality of memory cells 22 according to the present invention. Cross-sectional views of the device showing details of a cell are provided in FIGS. 2-4. The device is formed on a substrate 24 of crystalline silicon material whose upper surface lies in a <100> crystal plane. This substrate material has a preselected conductivity (e.g. P-type material in the range of 0.04 to 2 ohm cm.) An epitaxial layer 26 of uniform thickness (e.g. 3 microns) and having the same conductivity type is provided on the upper surface of the substrate. An intermediate layer 28 may be formed between the substrate and its epitaxial layer for controlling capacitance, punch-through and threshold voltage. A series of diffused bit lines 30 having the opposite (N-type) conductivity material from that of the substrate (e.g. 20–40 ohms per square) are formed in a parallel, spaced-apart order in the epitaxial layer. Located within the epitaxial layer and substrate below the bit lines and spaced apart at intervals in a series of buried source areas 32 each formed of material having the same conductivity type as the bit lines. Extending over the bit lines and the epitaxial layer is an insulating layer 34 of silicon dioxide.

The bit lines are arranged in pairs and between each pair is a series of elongated V-groove type recesses 36 that extend transversely and generally perpendicular to the bit lines. Within each recess its sloping walls are covered with a thin oxide layer 38 (e.g. 800 Å) that provides a gate dielectric. Covering this dielectric within each recess is a gate 40 of conductive material that continues across the insulating material between bit line pairs to form word lines 42 that are perpendicular to the bit lines.

Extending transversely across the center of each recess and parallel to the bit lines is a diffused area 44 of P+ type material that provides a channel stop and thereby electrically isolates one end of each recess from its other end. Just above this channel stop region 44 is a somewhat thicker region of the oxide layer 38. Thus, each V-shaped recess 36 between a pair of bit lines serves to provide two memory cells 22 in a relatively small amount of chip area.

The production of a memory device 20 as described may be accomplished by implementation of a fabrication method which, according to the present invention, comprises a series of steps as illustrated in FIGS. 5 to 14. One important feature of the method is that it not only provides for the efficient formation of the memory core structure for the device but also provides for the simultaneous formation of the various elements comprising the necessary logic circuitry required on the same chip adjacent to the memory core. In the method, the preliminary steps are accomplished in the conventional manner familiar to those skilled in the fabrication of semiconductor devices. Thus, on a silicon wafer whose upper surface is in the <100> crystal plane and having the desired conductivity type (e.g. 0.04 to 2.0 ohm cm.), a first mask is used to form the diffused buried source areas 32 of the opposite conductivity at the desired spaced-apart intervals. Thereafter, the epitaxial layer 26 of a uniform thickness (e.g. around 3 microns) is grown on the substrate and over the buried source regions using conventional techniques. During the formation of the epitaxial layer and subsequent steps, the substrate 24 is heated to cause an out-diffusion of P-dopant from the substrate to create the thin intermediate layer 28 along the interface of the substrate and epitaxial layer.

Now as shown in FIG. 5, a thin layer (e.g. 400 Å) of silicon dioxide 46 is formed over the entire surface of the epitaxial layer by the conventional oxidation procedure. Over this thin layer a similarly thin layer of silicon nitride 48 is formed, also by the conventional deposition technique.

In the next series of steps, a second mask is used to define island areas 50 of silicon nitride at locations where V-groove recesses will be etched (FIGS. 6 and 7). As these nitride areas are formed for the memory core, other nitride areas 50a are simultaneously formed, as shown typically in the plan view FIG. 6, for the peripheral logic or driver circuitry of the device.

Now as shown in FIG. 8, a third mask is used to form a series of elongated N+ drain regions that become the bit lines 30 in the epitaxial layer 26. The mask here is aligned so that the bit lines extend across the opposite ends of the nitride areas 50 and over the aligned, spaced-apart buried source regions 32. The bit lines are formed by a conventional diffusion procedure which includes the sub-steps of depositing and developing photoresist out of the bit line regions wherein the oxide and any silicon nitride films are removed to form exposed bit line regions 52. Within these exposed regions N-type material (e.g. arsenic) is diffused or implanted to form the bit lines 30 (FIG. 9).

Following this diffusion step, a thick oxide layer 54 (e.g. 8000 Å) is grown over the field and the N-type diffused regions, as shown in FIG. 10. The remaining oxide silicon nitride regions 56 prevent the oxidation of these regions.

A fourth mask (which defines V-grooves) is used to remove the oxide-silicon nitride regions 56 where the V-groove recesses 36 are then anisotropically etched into the silicon substrate 24. Thus, by this process, the ends of the V-groove recesses are self-aligned with the edges of the adjacent bit lines and zero alignment tolerances are achieved. (See FIG. 11)

The silicon nitride-oxide regions 56 are then removed. Following this, a thin gate oxide layer 38 (e.g. 800 Å) is grown within each V-groove recess and about 700 Å is grown on contact regions 58 and planar gate regions 60 for the peripheral logic elements. A P-type enhancement implant is then performed to adjust the planar MOS threshold. Silicon nitride is then deposited, masked and etched to form a mask 62 for the channel stop regions 44 in the bottom of each V-groove recess. Using this channel stop mask, a boron implant is made to form these P-type channel stop regions. (See FIG. 12)

Thereafter, thick oxide 64 is grown at the bottom and sides of the V-groove in the channel stop region. (FIG. 13). Following this procedure, the nitride from the fifth mask is stripped.

With the channel stop regions formed, a sixth (contact type) mask 66 is used to remove the oxide from contact regions 58. These contact regions are then doped N-type. Thereafter, metal interconnect lines are formed by the standard evaporation process and a seventh mask is used to define the metal word lines 42 and interconnects 68. A final eighth mask is then used to provide for a standard passivation layer and PAD process for the device.

A circuit diagram for a portion of a memory cell array of the memory device 20 according to the present invention is shown in FIG. 15 to illustrate its operation. As indicated, the word or address lines 42 are arranged to cross a series of bit lines 30 arranged in pairs with the pairs of memory cells 22 connected between pairs of bit lines. This bit lines are connected to a suitable bit line driver and sense-amplifier circuit (not shown) and the word/address lines are similarly connected to appropriate driver circuitry (not shown), which may be the same as that used in other semiconductor memory devices. In operation, information is stored in the memory device by addressing selected cells through the driver circuitry of appropriate address lines 42. The transistor of a cell 22 is "turned on" when a positive gate voltage (in the case of an N-channel device) is applied through an address line. When a voltage equivalent to a logic "one" level is applied through a bit line driver circuit to the transistor drain of the addressed cell, it charges up its storage capacitor 32 to a storage voltage level. The transistor of the cell is then turned off when the gate voltage level is returned to a lower potential. The storage voltage is then trapped and held on the storage capacitor 32.

When the device is to be read out, the foregoing storage process is reversed. Thus, a reference voltage is placed on the selected bit line and the selected address line is supplied again with a voltage which turns on the transistor of the activated cell. This allows the stored charge to be transferred from the buried capacitor 32 of the cell onto the connected bit line. This changes the voltage level on the bit line from its reference voltage and the change is detected by the sense-amplifier or processing circuitry for that bit line.

With the channel stop region 44 across each V-groove recess the two cells 22 therein are isolated and no cross-talk can occur between bit lines. Yet with the V-groove recesses extending from the side edges of the bit lines, the amount of overlap of the bit line over the buried source areas 32 is minimized, resulting in reduced bit line capacitance over previous memory core arrangements.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. An integrated circuit semiconductor device having a memory core with an array of memory cells, said core compromising a substrate of crystalline silicon whose upper surface is in a <100> crystal plane;

an epitaxial layer on said substrate;

a series of parallel, elongated regions having the opposite conductivity from said substrate and located at spaced-apart intervals in said epitaxial layer to form bit lines;

a series of buried source regions located at aligned spaced-apart locations in said substrate, spaced-below and having the same conductivity type as said elongated regions;

a series of V-shaped recesses formed at spaced-apart locations between pairs of parallel bit lines, each end of each recess being contiguous with one side of a bit line, which also forms a drain region, and each end of each said recess extending downwardly into said buried source region located below said contiguous bit line;

a thin gate dielectric layer covering the inner walls at both ends of each said recess;

means forming a channel stopping region having the same conductivity of higher doping from said substrate and located between the ends of each said recess;

gate means located on said thin dielectric layer;

an insulating layer covering said epitaxial layer and said bit lines; and a plurality of conductive word line means extending generally perpendicular to said bit lines, each interconnecting said gate means of a series of aligned recesses.

2. An integrated circuit device as described in claim 1 wherein said substrate is P-type conductivity material, and said drain regions and buried source areas are N-type conductivity material.

3. An integrated circuit device as described in claim 2 wherein said epitaxial layer is P-type material that is more lightly doped than said substrate material.

4. An integrated circuit device as described in claim 2 wherein each said channel stopping means comprises a diffused region of P+-type material extending into said substrate from the walls of its said recess and located transverse to the longitudinal axis of said recess near a mid-point between its ends.

5. An integrated circuit device as described in claim 1 where in the spacing between pairs of said elongated drain regions and therefore the lengths of said recesses extending between is in the range of 14–16 microns.

6. An integrated circuit device as described in claim 1 wherein the centerline of said aligned buried source regions spaced below each bit line is located approximately under the inner edge of the bit line which is contiguous with a plurality of said recesses, so that each said buried source region extends around the sidewalls of one end of each said recess; whereby the bit line capacitance for each memory cell is minimized.

* * * * *

UNITED STATES PATENT AND TRADEMARK OFFICE
CERTIFICATE OF CORRECTION

PATENT NO. : 4,271,418

DATED : June 2, 1981

INVENTOR(S) : William R. Hiltpold

It is certified that error appears in the above—identified patent and that said Letters Patent is hereby corrected as shown below:

In Column 4, line 39, delete "This"

and insert --The--.

*Signed and Sealed this*

Eighth *Day of* September 1981

[SEAL]

*Attest:*

GERALD J. MOSSINGHOFF

*Attesting Officer*     *Commissioner of Patents and Trademarks*